United States Patent
Ghyselen et al.

(10) Patent No.: US 7,265,435 B2
(45) Date of Patent: Sep. 4, 2007

(54) METHOD FOR IMPLANTING ATOMIC SPECIES THROUGH AN UNEVEN SURFACE OF A SEMICONDUCTOR LAYER

(75) Inventors: Bruno Ghyselen, Seyssinet-Pariset (FR); Takeshi Akatsu, Saint Nazaire les Eymes (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 135 days.

(21) Appl. No.: 11/261,785

(22) Filed: Oct. 31, 2005

(65) Prior Publication Data
US 2006/0051944 A1 Mar. 9, 2006

Related U.S. Application Data

(62) Division of application No. 10/840,599, filed on May 5, 2004, now Pat. No. 7,018,913.

(30) Foreign Application Priority Data
Jul. 10, 2003 (FR) .................................. 03 08462

(51) Int. Cl.
 *H01L 31/288* (2006.01)
 *H01L 21/425* (2006.01)

(52) U.S. Cl. ...................................... 257/611; 438/517

(58) Field of Classification Search ........ 438/515–518, 438/520, 528; 257/550, 586
See application file for complete search history.

(56) References Cited

U.S. PATENT DOCUMENTS

| 5,906,708 A | 5/1999 | Robinson et al. ............ 438/694 |
| 6,100,166 A | 8/2000 | Sakaguchi et al. .......... 438/455 |
| 6,274,439 B1 | 8/2001 | Ito .............................. 438/278 |
| 6,326,279 B1 | 12/2001 | Kakizaki et al. ............. 438/406 |
| 6,867,067 B2 | 3/2005 | Ghyselen et al. ............ 438/107 |

FOREIGN PATENT DOCUMENTS

JP 04-168764 A 6/1992

*Primary Examiner*—Calvin Lee
(74) *Attorney, Agent, or Firm*—Winston & Strawn LLP

(57) ABSTRACT

A method for implanting atomic species through an uneven surface of a semiconductor layer. The technique includes applying a covering layer upon the uneven surface in an amount sufficient and in a manner to increase surface uniformity. The method also includes implanting atomic species through the covering layer and uneven surface to obtain a more uniform depth of implantation of the atomic species in the layer.

13 Claims, 3 Drawing Sheets

METHOD FOR IMPLANTING ATOMIC SPECIES THROUGH AN UNEVEN SURFACE OF A SEMICONDUCTOR LAYER

CROSS-REFERENCE TO RELATED APPLICATIONS

This application is a division of application Ser. No. 10/840,599 filed May 5, 2004 now U.S. Pat. No. 7,018,913, the entire content of which is expressly incorporated herein by reference.

BACKGROUND ART

The present invention relates to processing semiconductor wafers, especially for use in applications such as electronics, microelectronics, and optoelectronics. In particular, the invention pertains to an implantation process for a wafer that includes at least a layer having an uneven surface, wherein implanting occurs through the uneven surface.

It is known to employ implantation processes for semiconductor wafers to obtain various effects. For example, implantation can be used to create a weakened zone within the thickness of the wafer. The SMART-CUT® process is an example of an implantation method that produces a weakened zone. A general description of the SMART-CUT® process can be found, for example, in "Silicon-On-Insulator Technology: Materials to VLSI", $2^{nd}$ edition by Jean-Pierre Colinge, from Kluwer Academic Publishers, pages 50 and 51.

When a weakened zone is to be created in the thickness of the wafer, for example by using a layer transfer method such as a SMART-CUT® type process, it is generally preferred for the weakened zone to have an even surface that extends substantially in a plane. In general, for numerous implantation applications, it is desirable to implant species so that the implanted samples are evenly distributed in the thickness of the wafer at a particular implantation depth under the surface of the wafer. Implantation that occurs through an uneven surface adversely affects the uniformity of the depth of implantation of the samples. FIG. 1 illustrates this phenomenon. Referring to FIG. 1, samples have been implanted in a wafer 10 through a layer 12 of material having an uneven surface 120, and through a portion of the substrate 11 upon which the layer 12 is located. Due to the uneven character of the surface 120, the depth of implantation (shown by the line 13) is also uneven. This is a disadvantage.

In this text "uneven surface" means a surface having a roughness value that is greater than a value on the order of several angstroms in root mean square (rms) value. It should also be noted that in the present text an even surface is one that has a roughness value less than several angstroms rms.

SUMMARY OF THE INVENTION

Provided is a method for implanting atomic species through an uneven surface of a semiconductor layer. The method includes applying a covering layer upon the uneven surface in an amount sufficient and in a manner to increase surface uniformity, and then implanting the atomic species through the covering layer and uneven surface to obtain a more uniform depth of implantation of the atomic species in the layer.

In a preferred embodiment, the semiconductor layer is a multilayer wafer comprising at least a substrate and a layer having an uneven surface. The covering layer is preferably deposited onto the uneven surface layer to form a substantially flat upper surface through which the atomic species can be implanted. Advantageously, the material of the covering layer is selected to increase the uniformity of the depth of implantation. In a preferred embodiment, the material of the covering layer is chosen to minimize differences between a coefficient of implantation depth of the semiconductor material of the uneven surface layer and a coefficient of implantation depth of the covering layer material. In one embodiment, the uneven surface layer comprises at least one of diamond, $Si_3N_4$, AlN, or polycrystalline silicon.

In another embodiment, the covering layer may include at least two layers of different material. The materials selected for each layer of the covering layer are advantageously selected to increase the uniformity of the depth of implantation. In an beneficial implementation, the materials selected for each layer of the covering layer are chosen to minimize the difference between a coefficient of implantation depth of the semiconductor material of the uneven surface layer and the overall coefficient of implantation depth of the covering layer. In an advantageous embodiment, the covering layer is applied such that it includes a plane surface. It also is advantageous to process the surface of the covering layer to form the pane surface prior to implanting atomic species. Such processing may include a planning process or polishing. In a preferred embodiment, implantation is conducted using at least one of hydrogen or helium. The method may also include conducting a layer transfer method.

BRIEF DESCRIPTION OF THE DRAWINGS

Other aspects, purposes and advantages of the invention will become clear after reading the following detailed description with reference to the attached drawings, in which.

DETAILED DESCRIPTION OF THE PREFERRED EMBODIMENTS

Figure 2:
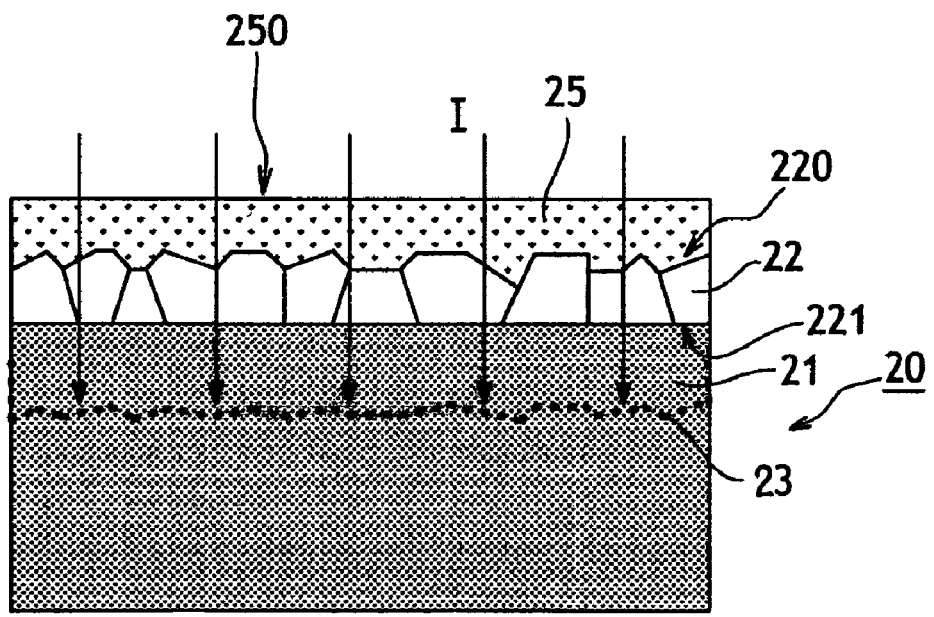
FIG. 2 illustrates the effect on the uniformity of the implantation depth when a covering layer is used prior to implantation.

FIG. 2 shows a wafer 20 which includes a layer 22 having an uneven surface 220, on a layer of a substrate 21. It is noted that a layer 25 covers the uneven surface 220. The layer 22 can be made from, for example, diamond CVD, $Si_3N_4$, AlN or a polycrystalline material such as polycrystalline silicon. Such materials are rugged and can, for example, be employed as a layer of a SOI (Silicon On Insulator) wafer, to improve the properties of thermal conductivity of the SOI wafer. It may therefore be preferable to form the insulation layer of such a wafer not from $SiO_2$ (wherein the thermal conductivity properties are not good), but by one or several materials which have high thermal conductivity, such as diamond or $Si_3N_4$. Layers of such materials are generally obtained by epitaxy, but the surface of such epitaxial layers is uneven.

The layer 22 typically is comprised of material having a substantial hardness (diamond, for example). But the layer may be difficult to polish evenly because it is a heterogeneous material (such as a polycrystalline material) which is delicate. For these reasons, the layer 22 may be difficult to polish, or in general, be difficult to plane. The layer 22 may be comprised of a material with a high retail price, in which case material losses should be minimized as much as possible.

The layer 22 may have been obtained by depositing material onto the flat surface of the substrate 21. A Chemical Vapor Deposition (CVD) technique may be used to deposit the material to form the layer 22, which is a chemical deposit of a material in a vacuum.

It will be noted that the surface 220 of the layer 22 is uneven, but the other face 221 which interfaces with the substrate 21 is flat. The face of the substrate 21 is in fact itself flat. In the embodiment of the invention shown in this figure, the wafer 20 is a multilayer wafer, which means that it is composed of several layers (in this case, substrate layer 22 plus layer 21). However, it is possible to utilize the present method to produce uniform implantation in a monolayer wafer with an uneven surface, or to produce uniform implantation inside a layer having an uneven surface and situated on or in a multilayer wafer.

Figure 1:
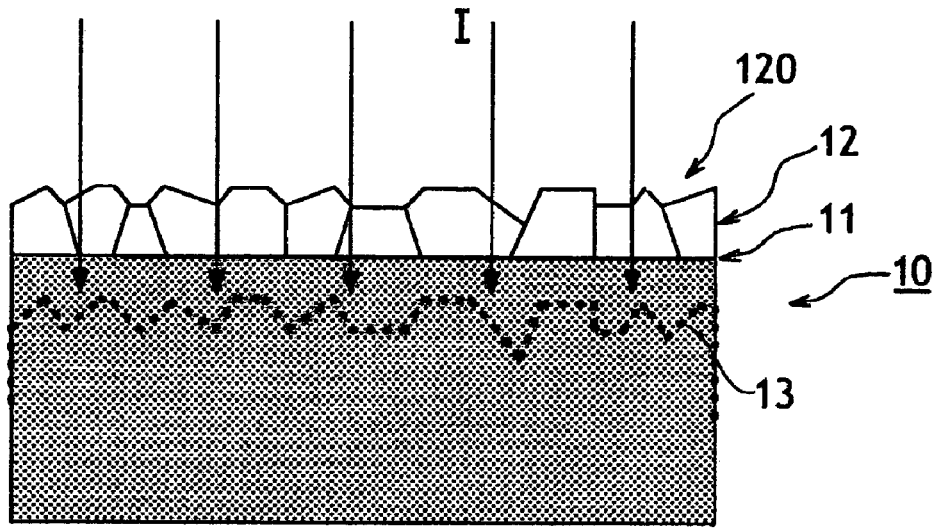
FIG. 1 illustrates implantation of samples in a wafer through a semiconductor layer having an uneven surface, and through a part of the substrate on which the semiconductor layer is located.

Referring to FIG. 2, the wafer 20 comprises a substrate layer 21 under the layer 22. Species are implanted and pass through the uneven surface of layer 22 to create a zone 23 in the thickness of the substrate 21 that corresponds to the maximum concentration of the implanted samples. In this embodiment, the covering layer 25 was applied to the wafer 20 before implantation. For example, the covering layer 25 may have been deposited upon the surface layer 22. It is noted that the surface 250 of the covering layer 25 is planar. Such a planar surface may be obtained by processing surface 250 by using a planing process that includes a polishing technique, for example. It is noted that the zone 23 of FIG. 2 is more even than the zone 13 of FIG. 1.

Covering the uneven surface 220 of the layer 22 with a layer having a flat surface prior to the implantation stage results in increasing the implantation of species to a substantially uniform depth. In the case where the invention is used to conduct a SMART-CUT® type process, an even weakened zone 23 can be created by implanting species through the covering layer and the uneven surface of the layer 22. The invention can thus be implemented within the scope of a SMART-CUT® or other transfer layer type process. In this case, following an implantation step the surface 250 is adhered to a stiffener, the substrate 21 is detached at the weakened zone 23, and optionally, the free surface created at the zone 23 is processed.

It is also possible to insert a fine, electrically insulating layer between the surface 250 and the stiffener, before adhering the stiffener to the surface 250. For example, an electrically insulating layer made of $SiO_2$ could be deposited on the surface 250. In this case, the layer 25 and a supplementary layer (the insulating layer) together form the covering layer. The fine insulating layer can be deposited on the covering material, which has already been applied to the surface 220, prior to the implantation step, so that the fine layer is part of the covering layer 25 (see the cases illustrated in FIG. 3). Generally, the covering layer 25 can be made of several layers of different materials, as described later in this text.

When the present method is used with a SMART-CUT® type process, the substrate 21 can be made of monocrystalline silicon. Monocrystalline silicon can also be used for other applications. Hydrogen and/or helium may be used to implant species and when conducting a SMART-CUT® type process.

Figure 3:
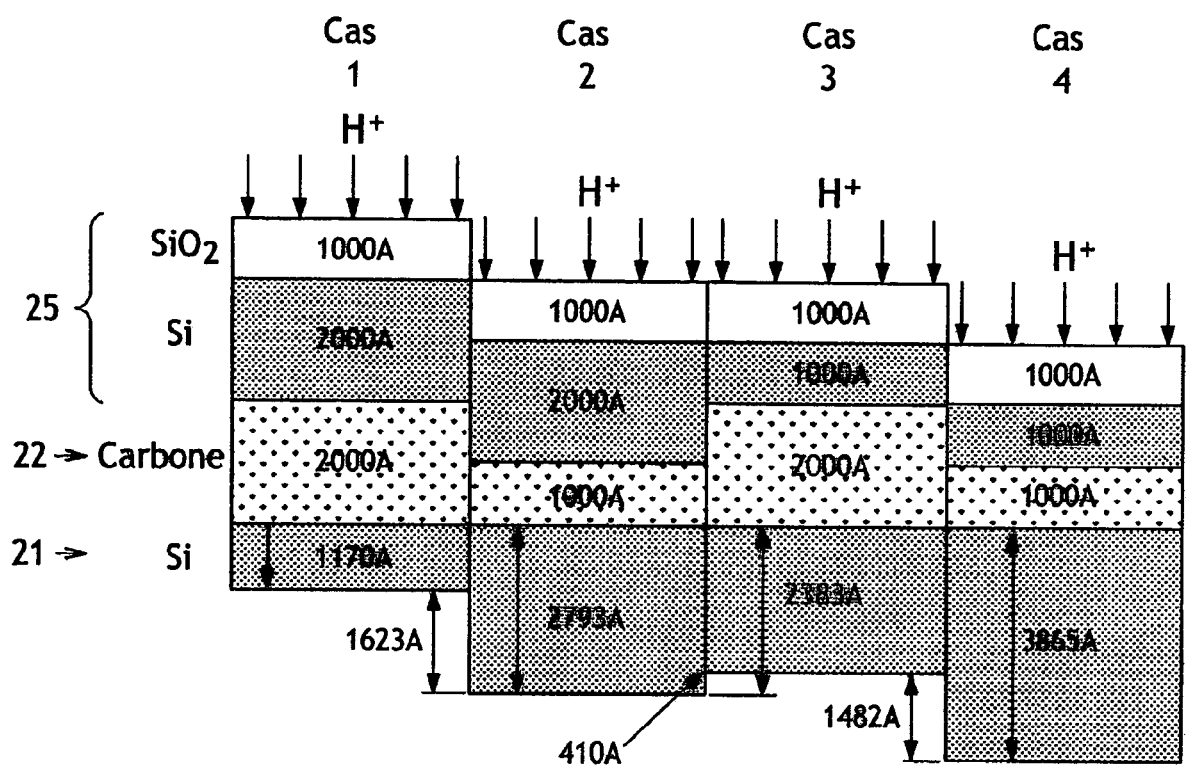
FIG. 3 shows simulation results that illustrate the effect of the thickness of the covering layer on the local depth of implantation, as well as the effect of planing the covering layer.

FIG. 3 illustrates the effect caused by the thickness of the covering layer on the local depth of implantation, and the effect caused by planing the covering layer. The four cases represent four local conditions of implantation through a covering layer 25 and a layer with an uneven surface 22, to a depth within the thickness of a substrate 21 (wherein reference numbers 21, 22, 25 correspond to the different layers illustrated in FIG. 2). The results shown in FIG. 3 are based on simulations wherein the layer 21 had the characteristics of monocrystalline silicon, the layer 22 had an uneven surface and the characteristics of carbon (carbon corresponding to diamond), and the layer 25 was composed of two layers. The two layers were a layer of silicon deposited on the uneven surface of the layer 22 of carbon (in FIG. 3 the irregularities of this layer correspond to the different thicknesses of carbon in the different simulations), and a layer of $SiO_2$ covering the layer of silicon.

The four simulations shown in FIG. 3 correspond to four conditions wherein hydrogen was implanted. The first case corresponds to a carbon layer having a thickness of 2000 angstroms, covered by a 2000 angstroms thick silicon layer and a 1000 angstroms thick $SiO_2$ layer. In this case, the depth of implantation of atomic species into the silicon substrate 21 is 1170 angstroms. The second case corresponds to a carbon layer thickness of 1000 angstroms, covered by a 2000 angstroms thick silicon layer and a 1000 angstroms thick $SiO_2$ layer. In this second case, the depth of implantation into the silicon substrate 21 is 2793 angstroms. The third case corresponds to a carbon thickness layer of 2000 angstroms, covered by a 1000 angstroms thick silicon layer and 1000 angstroms thick $SiO_2$ layer. In this third case, the depth of implantation into the silicon substrate 21 is 2383 angstroms. The fourth case corresponds to a carbon thickness layer of 1000 angstroms, covered by a 1000 angstroms thick silicon layer and 1000 angstroms thick layer of $SiO_2$. In this fourth case, the depth of implantation into the silicon substrate 21 is 3865 angstroms. The implantation conditions (dose, energy, etc.) were the same in all four cases.

These results illustrate several phenomena. First, when implanting occurs through a covering layer and through the carbon layer 22 having an uneven surface, the effect of the irregular surface of the layer 22 on the implantation depth is not only reproduced but is amplified. This is illustrated by comparing cases 1 and 2 which shows that there is a difference of 1623 angstroms in the depth of implantation, even though the difference in the thickness of the carbon layers is only 1000 angstroms. The same result is illustrated by comparing cases 3 and 4 which shows a difference of 1482 angstroms in the depth of implantation, even though the difference in thickness of the carbon layers is only 1000 angstroms. Second, when there is an uneven layer 22 and the surface of the covering layer 25 is planed, the difference in the depth of implantation for cases having different carbon layer thicknesses is substantially reduced. A comparison of cases 2 and 3 illustrates that there is a difference of only 410 angstroms in the depth of implantation, even though the carbon layers differ in thickness by 1000 angstroms. The comparison of cases 2 and 3 corresponds to a situation in which the layer of silicon that contributes to forming the covering layer 25 has been planed prior to the deposit of the $SiO_2$ layer. The comparison of these two cases thus illustrates the benefit of planing the silicon layer before depositing the SiO$_2$ layer. A planed covering layer is particularly advantageous to minimize the differences in implantation depth generated by the differences in thickness of the carbon layer 22 which has an uneven surface.

It is also possible, according to a variant of the invention, to locally adapt or modify the thickness of the covering layer 25 in different places on the wafer. Consequently, the depth of implantation may be selectively controlled with the goal of further increasing evenness. A local modification of the thickness of the covering layer 25 can be accomplished at the time the layer is deposited, or by subsequent processing (such as by planing or using a selective chemical etching process, and the like).

FIG. 3 illustrates an implementation according to the invention concerning a covering layer 25 formed from Si and SiO$_2$ layers. As described below, the nature of the material or materials utilized for the covering layer can also have an influence on the differences in implantation depth.

Figure 4:
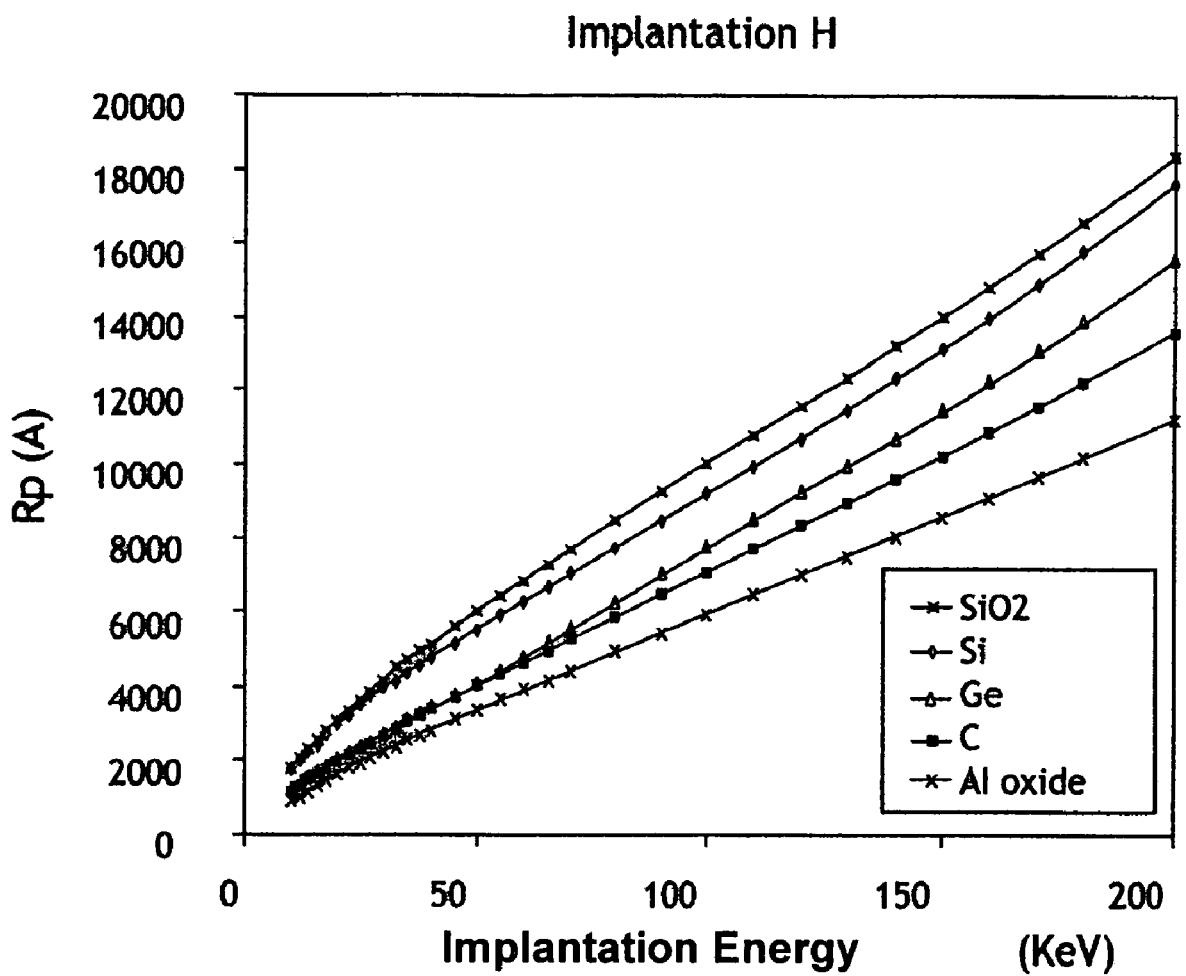
FIG. 4 is a graph showing the differences in coefficients of implantation depth for different materials when implanting hydrogen.

FIG. 4 is a graph that illustrates the average depth of implantation (sequenced Rp(A), in angstroms) as a function of the energy of implantation (along the abscissa, wherein the energy of implantation is in KeV), for implanting hydrogen in different materials. FIG. 4 shows that, for the same conditions, the average depth of implantation differs according to the nature of the material into which the hydrogen is implanted. Each material can thus be characterized by a particular coefficient of implantation depth. FIG. 4 illustrates that certain materials can be classified in decreasing order of this coefficient (that is, for the same implantation conditions the material having a higher coefficient will have greater implantation depths). As shown, the materials having greatest implantation depths in decreasing order are SiO$_2$, Si, germanium, carbon (diamond), and aluminum oxide. The differences concerning the coefficient of implantation depth can be advantageously exploited within the scope of the invention.

It is possible to improve the uniformity of implantation by using a covering layer 25 made of one or more materials, in which each material has a coefficient of implantation depth that is as close as possible to the coefficient of implantation depth associated with the material of the uneven surface layer 22. By using such a covering layer 25, and by planing (preferably including polishing) the surface of the covering layer, the best conditions are created for minimizing the differences in depth of the implanted species that could occur due to the differences in thickness of the layer 22. In this case an overall layer that includes the combination of the layers 22 and 25 is created. This overall layer has a constant thickness (due to the planing process), and a coefficient of depth of implantation that is as homogeneous as possible.

It is also possible to combine several layers of different materials inside the covering layer 25 so that the average of the coefficients of implantation depth of the different materials corresponds to the value of the coefficient of implantation depth of the uneven layer 22. The average of coefficients can be weighted by the respective thicknesses of the different layers that form the covering layer 25.

What is claimed is:

1. A multilayer wafer comprising:
a substrate;
a layer having an uneven surface;
a covering layer upon the uneven surface in an amount sufficient and in a manner to increase surface uniformity; and
a uniform weakened zone formed by implantation of atomic species through the covering layer and the uneven surface, wherein the covering layer provides increased uniformity of the weakened zone compared to multilayer wafers in which atomic species are implanted through the uneven surface without the covering layer.

2. The multilayer wafer of claim 1, wherein the covering layer is present on the uneven surface to form a substantially flat upper surface through which the atomic species can be implanted.

3. The multilayer wafer of claim 1, wherein the covering layer comprises a material that is selected to increase the uniformity of the depth of implantation.

4. The multilayer wafer of claim 1, wherein the covering layer comprises a material that is chosen to minimize differences between a coefficient of implantation depth of semiconductor material of the uneven surface layer and a coefficient of implantation depth of the covering layer material.

5. The multilayer wafer of claim 1, wherein the covering layer comprises at least two layers of different materials.

6. The multilayer wafer of claim 5, wherein the covering layers each comprise a material selected to increase the uniformity of the depth of implantation.

7. The multilayer wafer of claim 5, wherein the material of each covering layer minimizes the difference between a coefficient of implantation depth of semiconductor material of the uneven surface layer and an overall coefficient of implantation depth of the covering layer.

8. The multilayer wafer of claim 1, wherein the covering layer includes a plane surface.

9. The multilayer wafer of claim 8, wherein the covering layer is polished to provide the plane surface.

10. The multilayer wafer of claim 1, wherein the implanted ions include at least one of hydrogen ions or helium ions.

11. The multilayer wafer of claim 1, wherein the uneven surface layer comprises at least one of diamond, Si$_3$N$_4$, AlN, or polycrystalline silicon.

12. The multilayer wafer of claim 1, wherein the covering layer comprises at least one of SiO$_2$, Si, germanium, carbon or aluminum oxide.

13. The multilayer wafer of claim 1, wherein the covering layer also includes a fine insulating layer of diamond or Si$_3$N$_4$.

* * * * *